(12) United States Patent
Yang et al.

(10) Patent No.: US 9,247,613 B2
(45) Date of Patent: Jan. 26, 2016

(54) QUANTUM DOT ELECTROLUMINESCENCE DISPLAY DEVICE AND DISPLAY APPARATUS

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ming Yang, Beijing (CN); Xi Chen, Beijing (CN); Peizhi Cai, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/345,025

(22) PCT Filed: May 31, 2013

(86) PCT No.: PCT/CN2013/076587
§ 371 (c)(1),
(2) Date: Mar. 14, 2014

(87) PCT Pub. No.: WO2014/166149
PCT Pub. Date: Oct. 16, 2014

(65) Prior Publication Data
US 2015/0145405 A1 May 28, 2015

(30) Foreign Application Priority Data
Apr. 9, 2013 (CN) .......................... 2013 1 0121299

(51) Int. Cl.
*H01L 51/50* (2006.01)
*H01L 51/52* (2006.01)
(Continued)

(52) U.S. Cl.
CPC .............. *H05B 33/12* (2013.01); *H01L 27/322* (2013.01); *H01L 27/3211* (2013.01); *H01L 2251/5369* (2013.01)

(58) Field of Classification Search
CPC .. H05B 33/12; H01L 27/3211; H01L 27/322; H01L 2251/5369; H01L 25/0753; H01L 33/502; H01L 33/507
USPC .................................................. 313/498–512
See application file for complete search history.

(56) References Cited

U.S. PATENT DOCUMENTS 8,242,518 B2 * 8/2012 Lerman et al. .................. 257/88
8,242,679 B2 * 8/2012 Noh ............................... 313/483
(Continued)

FOREIGN PATENT DOCUMENTS

CN 102185059 A 9/2011
CN 203179892 U 9/2013

OTHER PUBLICATIONS

International Search Report for International Application No. PCT/CN2013/076587, 12 pgs.
(Continued)

*Primary Examiner* — Anne Hines
*Assistant Examiner* — Jose M Diaz
(74) *Attorney, Agent, or Firm* — Ladas & Parry LLP

(57) ABSTRACT

A quantum dot electroluminescence display device and display apparatus are provided, and a electroluminescence structure (02) is provided in sub-pixel units of different colors of each pixel unit, a monochromatic quantum dot layer (03) is provided in at least one sub-pixel unit of a color of each pixel unit and located on a light exiting side of the electroluminescence structure of the at least one sub-pixel unit of a color, and the monochromatic quantum dot layer (03) emits monochromatic light corresponding to the color of sub-pixel unit after it is excited by light emitted from the electroluminescence structure (02).

19 Claims, 3 Drawing Sheets

(51) Int. Cl.
*H01L 51/54* (2006.01)
*H05B 33/12* (2006.01)
*H01L 27/32* (2006.01)

(56) References Cited

U.S. PATENT DOCUMENTS

| | | | |
|---|---|---|---|
| 8,741,675 B2* | 6/2014 | Yoo et al. | 438/33 |
| 2008/0042552 A1* | 2/2008 | Cok | 313/501 |
| 2008/0224596 A1 | 9/2008 | Park et al. | |
| 2008/0284313 A1* | 11/2008 | Berben et al. | 313/501 |
| 2011/0273079 A1* | 11/2011 | Pickard et al. | 313/483 |
| 2012/0252145 A1* | 10/2012 | Yoo et al. | 438/29 |
| 2013/0278134 A1* | 10/2013 | Ko et al. | 313/503 |
| 2014/0125222 A1* | 5/2014 | Hikmet et al. | 313/504 |

OTHER PUBLICATIONS

First Office Action (Chinese language) issued by the Chinese Patent Office for Chinese Patent Application No. 201310121299.1 dated Feb. 2, 2015, 7 pages.

English translation of First Office Action issued by the Chinese Patent Office for Chinese Patent Application No. 201310121299.1 dated Feb. 2, 2015, 5 pages.

English abstract of CN203179892U, listed above; 1 page.

International Preliminary Report on Patentability dated Oct. 13, 2015; PCT/CN2013/076587.

\* cited by examiner

QUANTUM DOT ELECTROLUMINESCENCE DISPLAY DEVICE AND DISPLAY APPARATUS

CROSS REFERENCE TO RELATED APPLICATIONS

This application is based on International Application No. PCT/CN2013/076587 filed on May 31, 2013, which claims priority to Chinese National Application No. 201310121299.1 filed on Apr. 9, 2013. The entire contents of each and every foregoing application are incorporated herein by reference.

TECHNICAL FIELD

Embodiments of the present invention relate to a quantum dot electroluminescence display device and a display apparatus.

BACKGROUND

Organic electroluminescence displays (OELDs) have been applied more and more to flat panel displays in recent years due to the merits of lightness and thinness, wide viewing angle, fast response speed, high contrast, and so on. The technology of combining a blue-emitting OELD with a color conversion material is one of the technologies for realizing full color OELD, and color conversion materials currently used are mainly inorganic doped system materials that can be excited by blue light, such as, (1) Ce doped yttrium aluminum garnet; (2) Eu doped alkaline earth metal silicate; (3) silicon-based nitride or oxynitride doped with rare earth ions. However, these color conversion materials usually have problems of lower color purity and efficiency.

Quantum Dots (QDs) can also be called as nano-crystalline, for example, and are a kind of nano particles composed of group II-VI or group III-V elements. The grain size of quantum dots generally lies between 1 nm and 20 nm; because electrons and holes contained therein are quantum-confined, a continuous energy band structure is converted into a discrete energy level structure showing molecular properties, and fluorescence can be emitted after the particles are excited.

The emission spectrum of quantum dots can be controlled by modifying the size of quantum dots. By means of modifying the size of a quantum dot and its chemical composition, its emission spectrum can be expanded to cover the whole visible region. With a CdTe quantum dot as an example, when its grain size is increased from 2.5 nm to 4.0 nm, its emission wavelength may be subjected to redshift from 510 nm to 660 nm.

Both the fluorescent intensity and stability of quantum dots are good. At present, with the light-emitting property of quantum dots, quantum dots may function as molecular probes in the application of fluorescence marking, and quantum dots may also be applied to display devices, serving as light emitting sources of a backlight module of a liquid crystal display panel. Light emitted from a quantum dot after it is excited by blue light mixes with the blue light, so as to produce white light. The white light has a larger gamut, so that the picture quality can be enhanced. However, there is still not a design in which quantum dots are applied to an electroluminescence display device in prior art.

SUMMARY

According to embodiments of the present invention, there are provided a quantum dot electroluminescence display device and a display apparatus, capable of enhancing color purity and emission efficiency of the display device.

In one aspect of the invention, there is provided a quantum dot electroluminescence display device provided with a plurality of pixel units provided therein, each of which comprises a plurality of sub-pixel units for displaying different colors, the display device comprising: a base substrate; an electroluminescence structure that is disposed on the base substrate and located in sub-pixel units of each pixel unit; a monochromatic quantum dot layer that is disposed in at least one sub-pixel unit of a color of each pixel unit and is located on a light exiting side of the electroluminescence structure of the at least one sub-pixel unit of a color, for emitting monochromatic light corresponding to the color of the sub-pixel unit after it is excited by light emitted from the electroluminescence structure.

In another aspect of the invention, there is provided a display apparatus, comprising the quantum dot electroluminescence display device provided by embodiments of the invention.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not (imitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

A thickness of each layer of thin film and the shape of regions in accompanied drawings does reflect the real proportion, only for the purpose of illustrating contents of the invention schematically.

Unless otherwise defined, the technical or scientific terms used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," or "the" does not indicate limitation in number, but specifies the presence of at least one. A term "comprises," "comprising," "includes," "including", "contains" or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "On," "under," "left," "right" or the like is only used to describe a relative positional relationship, and when the absolute position of a described object is changed, the relative positional relationship might also be changed accordingly.

Figure 1A:
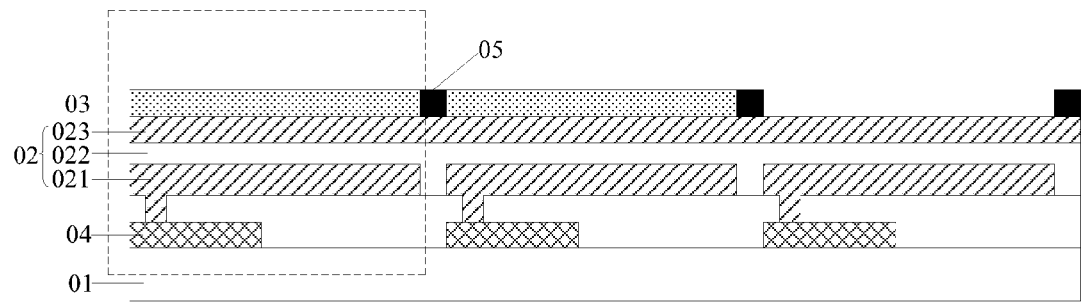
FIG. 1a to FIG. 1c are structurally schematic views each illustrating a quantum dot electroluminescence display device provided by an embodiment of the invention.
Figure 1B:
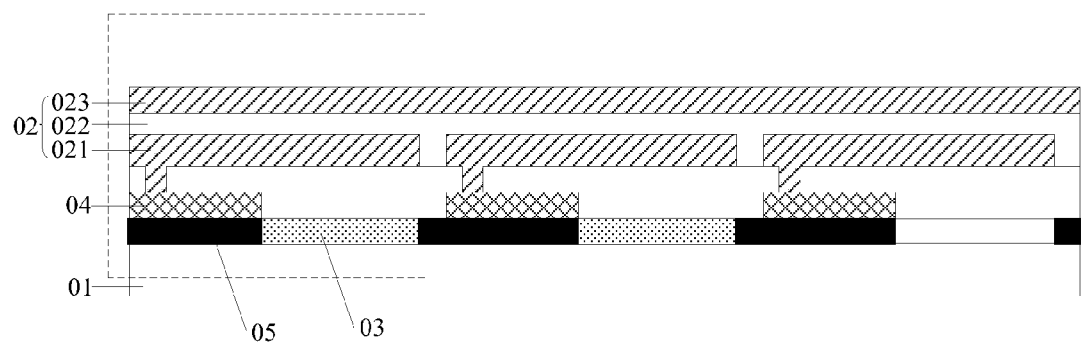

According to an embodiment of the invention, there is provided a quantum dot electroluminescence display device. As shown in FIG. 1a and FIG. 1b, a plurality of pixel units are provided within the display device, and each of the pixel units has a plurality of sub-pixel units (denoted by broken-line boxes in the figure) for displaying different colors. For example, these pixel units are arranged in a same plane in the form of an array (such as a matrix). Although the figures are schematically cross-sectional views merely illustrating three pixels side-by-side, apparently the invention is not limited thereto.

The display device includes: a base substrate 01; an electroluminescence structure 02 that is disposed on the base substrate 01 and located at the sub-pixel units of each pixel unit; a monochromatic quantum dot layer 03 that is disposed in at least one sub-pixel unit of a color of each pixel unit and is located on the light exiting side of the electroluminescence structure 02, for emitting monochromatic light corresponding to the color of the sub-pixel unit after it is excited by light emitted from the electroluminescence structure 02.

In the quantum dot electroluminescence display device of the embodiment of the invention, quantum dots are used as a color conversion material. These quantum dots can emit monochromatic light corresponding to the color of a sub-pixel unit after they are excited by light emitted from the electroluminescence structure. Because quantum dots have a narrow emission spectrum and high emission efficiency, the color purity of sub-pixel units constituting a pixel unit can be improved. Thus, the display quality of the display device is improved. Because particles in a monochromatic quantum dot layer can scatter light emitted from the electroluminescence structure, the transmittance of the color conversion material can be enhanced compared with the case where an inorganic doped system material is used as the color conversion material. Thus, emission efficiency of the display device is improved. Further, the quantum dot electroluminescence display device provided in the embodiment of the invention is an all-solid-state display device, and it can resist against shock and endure a lower temperature compared with a liquid crystal display device.

Electroluminescence (EL) is such a phenomenon that a material emits light when a current passes through it or a strong electric field is applied to it. In the embodiments of the invention, electroluminescence can be realized by use of a variety of optional materials, such as organic or inorganic electroluminescent materials, etc.

It is to be noted that monochromatic quantum dot layers stated in embodiments of the invention are located in a same level and quantum dots corresponding to different sub-pixel units are different from each other. The different quantum dots may involve the cases where the materials for the quantum dots differ or the sizes of the quantum dots differ, but the only thing to do is to make sure that monochromatic light is generated by quantum dots after they are excited in the region of a corresponding sub-pixel unit and its color is the same as the color to be rendered by the sub-pixel unit. Namely, the quantum dot layers are in such a state that, quantum dots in regions of sub-pixel units of the same color are the same, and quantum dots in regions of sub-pixel units of different colors are different, but quantum dots in each region can merely emit a kind of monochromatic light when excited. Therefore, such a color conversion layer formed by quantum dots is called as a monochromatic quantum dot layer.

In one example, the electroluminescence structure in the above quantum dot electroluminescence display device provided by the embodiment of the invention can be driven in an active manner. Namely, the electroluminescent structure located in each sub-pixel unit is controlled by a separate electronic element to achieve independent driving, for example, with a TFT (thin film transistor) as a switch device. In another example, the electroluminescence structure may be driven in a passive manner. The invention will not be limited thereto. Furthermore, various TFT devices in a drive circuit adopting an active driving manner may be such as amorphous silicon (a-Si) TFTs, oxide semiconductor TFTs, LTPS (low temperature polysilicon) TFTs or HTPS (high temperature polysilicon) TFTs.

All of the following quantum dot electroluminescence display devices provided in the embodiments of the invention will be described with reference to examples of active driving.

For example, the electroluminescence structure 02 in the above quantum dot electroluminescence display device provided by an embodiment of the invention, as shown in FIG. 1a and FIG. 1b, may include: a first electrode 021, a light-emitting layer 022 and a second electrode 023 that are disposed on the base substrate 01 in this order.

Figure 2:
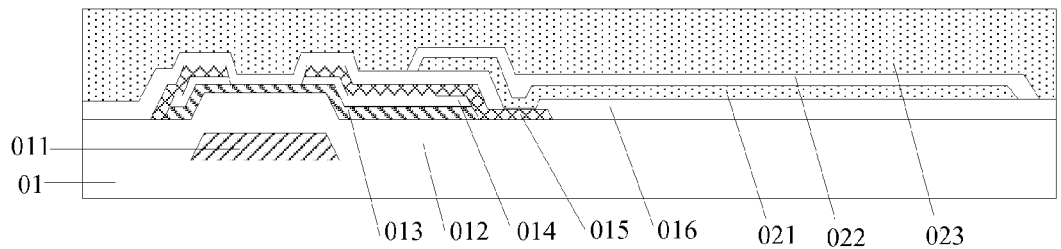
FIG. 2 is a structurally schematic view illustrating a drive circuit in a display device provided by an embodiment of the invention.

For example, a drive circuit 04 connected to each first electrode 021 is usually disposed between the first electrode 021 and the base substrate 01. One example of the drive circuit 04 is shown in FIG. 2, and it may include the following structures: a gate electrode 011, a gate insulating layer 012, an active layer 013, an ohmic contact layer 014, source and drain electrodes 015, and an insulating layer 016 that are formed on a base substrate in sequence. Patterns in these structures (such as pattern of a gate layer, pattern of a source and drain electrode layer, etc.) can be obtained by patterning processes, in which a film is formed by deposition, sputtering, or the like process, and then, is subjected to exposure, development, etching, etc.

Certainly, other exemplary structure of the drive circuit 04 may include other film layer(s) further, or it does not include the ohmic contact layer and so on. Regarding variants of these structures, the invention will not be limited thereto.

In one example, the electroluminescence structure 02 includes at least: a first electrode 021, a light-emitting layer 022 and a second electrode 023 that are disposed on the base substrate 01 in this order. For example, the first electrode 021 is usually an anode, which may be a thin film of ITO (indium tin oxide), IZO (indium zinc oxide), or the like material, whereby it can be a transparent electrode; the second electrode is usually a cathode, which may be a metal layer, and moreover, depending on difference in the light emitting direction of the electroluminescence structure 02, the metal layer may be translucent or opaque. Of course, in some other modifications of structures, the first electrode may be a cathode, the second electrode may be an anode, namely, the cathode is located above a drive circuit on a base substrate, and the anode is located above the cathode. All of these will not be limited in the invention. In addition to the above three layers, in other examples, the electroluminescence structure 02 may further include other layers, such as an electron injection layer, an electron transportation layer, a hole injection layer, a hole transportation layer, a hole blocking layer, and so on. Modifications of these structures will not be limited in the invention.

As shown in FIG. 1a, the electroluminescence structure 02 may be of a top-emission type, namely, the side on which the second electrode 023 is located is a light exiting side of the electroluminescence structure 02, and the monochromatic quantum dot layer 03 is located over the second electrode 023. In the electroluminescence structure of the top-emission type, light emitted from the light-emitting layer 022 needs to exit from the side where the second electrode 023 is located, and thus the second electrode 023 is generally of a transparent conductive material that is pervious to light, such as ITO, and the first electrode 021 is generally of an opaque metal that can reflect light. Furthermore, when the top-emission type is employed, the base substrate 01 may be made from an opaque metal, and may also be made from glass or a flexible substance (such as plastic). The drive circuit 04 serves to adjust a voltage inputted to each first electrode 021 and thereby regulate luminous intensity of the light-emitting layer 022 that comes out of the second electrode 023, so that the emission efficiency of each monochromatic quantum dot layer 03 is controlled; and moreover, a full-color display is realized with the aid of adjustment in the emission intensity of the various monochromatic quantum dot layers 03.

In one example, in order to avoid emission of quantum dots that is excited by light from being disturbed by emission of quantum dots that is excited by the electric current applied to the second electrode 023, an insulating layer (not shown in the figure) may be provided between the second electrode 023 and the monochromatic quantum dot layer 03.

As shown in FIG. 1b, the electroluminescence structure 02 may also be of a bottom-emission type, namely, the side on which the first electrode 023 is located is a light exiting side of the electroluminescence structure 02, and the monochromatic quantum dot layer 03 is located between the first electrode 023 and the base substrate 01, and is usually located between the drive circuit 04 and the base substrate 01. In the electroluminescence structure of the bottom-emission type, light emitted from the light-emitting layer 022 needs to exit from the side where the first electrode 023 is located, and thus the first electrode 023 is generally of a transparent conductive material that is pervious to light, such as ITO, and the second electrode 021 is generally of an opaque metal that can reflect light. The drive circuit 04 serves to adjust the voltage inputted to each first electrode 021 and thereby regulate luminous intensity of the light-emitting layer 022 that comes out of the first electrode 021, so that the emission efficiency of each monochromatic quantum dot layer is controlled; and, full-color display is realized with the aid of adjustment in the emission intensity of various monochromatic quantum dot layers.

For the display device of the top-emission type, the drive circuit 04 is generally disposed between the first electrode 021 and the base substrate 01, there is no light shielding layer (i.e. a light blocking layer for shielding a part of the drive circuit 04) to block on a light exiting side of the top-emission type, and therefore, compared with the bottom-emission type it has a higher aperture ratio, which is helpful for increasing transmittance of the display device, and can decrease power consumption of the display device.

Further, as shown in FIG. 1a and FIG. 1b, the monochromatic quantum dot layers 03 located in the transmissive regions of the sub-pixels may be separated from each other with a black matrix 05, so as to avoid undesirable cross-talk therebetween. For example, the material of the black matrix 05 is typically a polymer or resin that contains carbon black.

In one example, the light-emitting layer 022 in the electroluminescence structure may be of a material for emitting blue light, for example, which may be a GaN inorganic material capable of emitting blue light upon electroluminescent excitation, and may also be an organic material. Where an electroluminescence structure capable of emitting blue light is used to excite monochromatic quantum dot layers 03, for example, as shown in FIG. 1a and FIG. 1b, it is also possible that the blue light is directly used as one of the primary colors of a pixel unit. That is, if each pixel unit has sub-pixel units for displaying N colors, among which, sub-pixel units of (N−1) colors are each provided with a monochromatic quantum dot layer, and one sub-pixel unit has no monochromatic quantum dot layer provided therein, and the blue light emitted from the electroluminescence structure can be directly used as the primary color of the sub-pixel unit, here N is a positive integer larger than or equal to 2. When N is equal to 2, the display colors of two sub-pixel units composing one pixel unit may be orange and blue, respectively. For example, sub-pixel units of three primary colors of blue, red and green compose one pixel unit, in which, one of the sub-pixel units does not have a monochromatic quantum dot layer provided therein, namely, there is formed a through-hole structure, the blue light emitted from the electroluminescence structure directly exits without passing through a monochromatic quantum dot layer, and other two sub-pixel units have a monochromatic quantum dot layer for emitting red light and a monochromatic quantum dot layer for emitting green light provided therein, respectively.

Figure 1C:
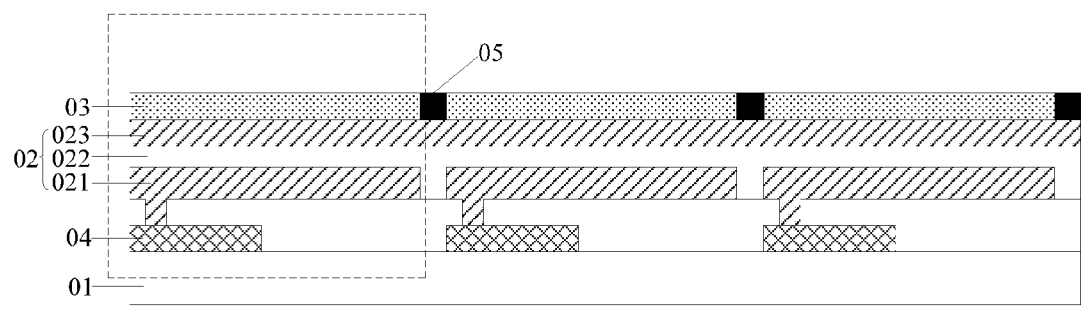

In another example, a material capable of emitting ultraviolet light may also be chosen as the material of light-emitting layer in the electroluminescence structure, and it may be an inorganic material, or may also an organic material. The invention is not limited thereto. When an electroluminescence structure capable of emitting ultraviolet light is used to excite the monochromatic quantum dot layers 03, as shown in FIG. 1c, it is necessary that the plurality of sub-pixel units of each pixel unit be each provided with a monochromatic quantum dot layer 03.

In one example, it is possible that the sub-pixel units of three or more primary colors compose one pixel unit. The invention is not limited thereto. When the sub-pixel units in more than three primary colors are used to compose one pixel unit, it is possible that the gamut of the display device is improved, color saturation is enhanced, and display quality of the display device is improved, compared with the case thin sub-pixel units in conventional three primary colors of red, green and blue compose one pixel unit.

In addition, the monochromatic quantum dot layers composing one pixel unit may emit red light, green light, yellow light, orange light, cyan light or other monochromatic light after they are excited by light emitted from the electroluminescence structure so as to achieve full-color display. For example, the material selected from the group consisting of CdS, CdSe, CdTe, ZnO, ZnSe and ZnTe in group II-VI, GaAs, GaP, GaAs, GaSb, HgS, HgSe, HgTe, InAs, InP, InSb, AlAs, AlP, and AlSbin in group III-V, and the like can be used as the material of a monochromatic quantum dot layer. For example, taking ZnS as an example, the size of a red-light-emitting quantum dot is mainly in the range of 9-10 nm, the size of a yellow-light-emitting quantum dot is 8 nm, and the size of a green-light-emitting quantum dot is 7 nm.

Furthermore, as the grain sizes of quantum dots is on the nanometer order, and in the same order of magnitudes of light wave, upon a quantum dot material being used as a color conversion material, light emitted from the light-emitting layer can be scattered by quantum dot particles, and therefore compared with an inorganic doped system material, transmittance of the color conversion material can be increased, thereby enhancing emission efficiency of the display device.

Figure 3A:
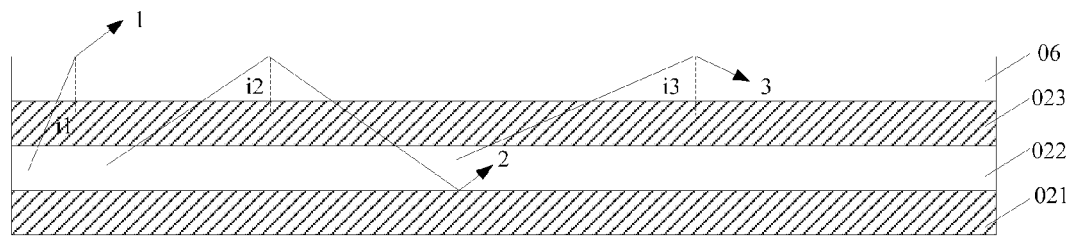
FIG. 3a is a schematic view illustrating refraction of light in an existing display device.
Figure 3B:
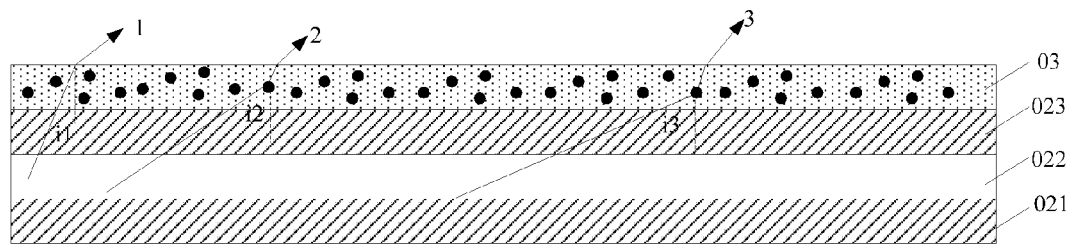
FIG. 3b is a schematic view illustrating refraction of light in a display device provided by an embodiment of the invention.

As shown in FIG. 3a and FIG. 3b, with the top-emission type as an example, provided that a light-emitting layer 022, a second electrode 023, an inorganic doped system material layer 06 for color conversion conventionally and a monochromatic quantum dot layer 03 have a same refractivity, which is n1, generally larger than the refractivity n0 of air. Where light travels from an optically denser medium to an optically thinner medium, when the incident angle reaches a certain critical angle, outgoing refracted light disappears, and in this case, a total reflection phenomenon occurs. Let the critical angle of the light-emitting layer 022, the second electrode 023, the inorganic doped system material layer 06 and the monochromatic quantum dot layer 03 which have a refractivity of n1 be i2, and incident angles of three light rays 1, 2 and 3 comply with $i1 < i2 < i3$. As shown in FIG. 3a, in a display device with an inorganic doped material layer 06 as the color conversion material, particles of the inorganic doped system material is larger, and does not have a scattering function, and therefore, only light ray 1 can be transmitted out of the display device, and light rays 2 and 3 undergo the total reflection phenomenon and cannot be transmitted out of the display device. As such, the display device in which the inorganic doped material layer 06 is used for color conversion has a lower light transmittance. Regarding three light rays 1, 2 and 3, incident angles of which comply with $i1 < i2 < i3$, as shown in FIG. 3b, in a display device with a monochromatic quantum dot layer 03 as color conversion, as the quantum dot material has a scattering function, all light rays 1, 2 and 3 can be transmitted out of the display device, thereby enhancing light transmittance of the display device.

Figure 4:
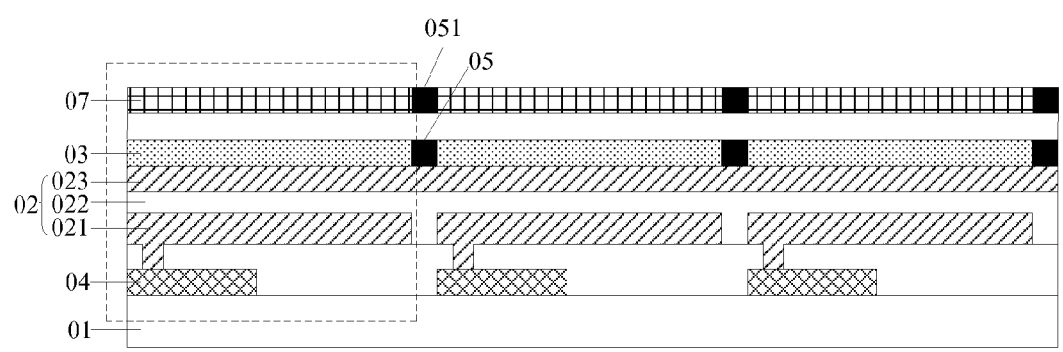
FIG. 4 is a structurally schematic view illustrating a quantum dot electroluminescence display device with a color filter layer, provided by an embodiment of the invention.

Further, in one example, in order to increase color purity of the emitted light of the pixel units in a display device, in the display device, as shown in FIG. 4, a color filter layer 07 which is disposed on a light exiting side of each sub-pixel unit and corresponds to the color of each sub-pixel unit may further be included. The color filter layer 07 is capable of filtering out stray light of the colors other than the color of the monochromatic light to be rendered by each sub-pixel unit, and thus color purity of the sub-pixel units are improved. Accordingly, the color filter layer 07 is also be divided into sub-pixel units by the black matrix 051, and the color of the color filter layer 07 in each sub-pixel unit corresponds to the color of the emitted light of the sub-pixel unit.

Based on the same inventive concept, according to an embodiment of the invention, there is further provided a display apparatus, comprising the above quantum dot electroluminescence display device provided by any of the embodiments of the invention. As the mechanism of the apparatus to solve the existing problems is similar to that of the forgoing quantum dot electroluminescence display device, the examples of the apparatus may refer to that of the quantum dot electroluminescence display device, and the description will not be repeated here.

With the quantum dot electroluminescence display device and display apparatus provided by embodiments of the invention, the electroluminescence structure is provided in sub-pixel units of each pixel unit, a monochromatic quantum dot layer is provided in at least one sub-pixel unit of a color of each pixel unit and located on a light exiting side of the electroluminescence structure, and the monochromatic quantum dot layer emits monochromatic light corresponding to the color of sub-pixel unit after it is excited by light emitted from the electroluminescence structure. In the embodiments of the invention, quantum dots instead of existing inorganic doped system are used as a color conversion material, and can emit monochromatic light after the quantum dots are excited by light emitted from the electroluminescence structure. Because quantum dots have a narrow emission spectrum and high emission efficiency, the color purity of sub-pixel units constituting a pixel unit can be enhanced. Thus, the display quality of the display device is improved. Furthermore, because particles in the monochromatic quantum dot layer can scatter light emitted from the electroluminescence structure, the transmittance of color conversion can be enhanced compared with an inorganic doped system material. Thus, emission efficiency of the display device is improved.

Descriptions made above are merely exemplary embodiments of the invention, but are not used to limit the protection scope of the invention. The protection scope of the invention is determined by attached claims.

The invention claimed is:

1. A quantum dot electroluminescence display device provided with a plurality of pixel units provided therein, each of which comprises a plurality of sub-pixel units for displaying different colors, the display device comprising:
   a base substrate;
   an electroluminescence structure, disposed on the base substrate and located at the sub-pixel units of each pixel unit;
   a monochromatic quantum dot layer, which is disposed in at least one sub-pixel unit of a color of each pixel unit and is located on a light exiting side of the electroluminescence structure of the at least one sub-pixel unit of a color, for emitting monochromatic light corresponding to the color of the sub-pixel unit after it is excited by light emitted from the electroluminescence structure, wherein the quantum dots in the monochromatic quantum dot layer are configured to have a scattering function.

2. The display device claimed as claim 1, wherein the electroluminescence structure includes: a first electrode, a light-emitting layer and a second electrode that are disposed on the base substrate in this order.

3. The display device claimed as claim 2, wherein a side on which the second electrode is located is a light exiting side of the electroluminescence structure, and the monochromatic quantum dot layer is located over the second electrode.

4. The display device claimed as claim 2, wherein a side on which the first electrode is located is a light exiting side of the electroluminescence structure, and the monochromatic quantum dot layer is located between the first electrode and the base substrate.

5. The display device claimed as claim 1, wherein a material of the light-emitting layer is a material for emitting blue light;
   each of the pixel units has the sub-pixel units for displaying N colors, among which, sub-pixel units of (N−1) colors are each provided with the monochromatic quantum dot layer, where N is a positive integer larger than or equal to 2.

6. The display device claimed as claim 1, wherein a material of the light-emitting layer is a material for emitting ultra-violet light;
   the plurality of sub-pixel units of each of the pixel units are each provided with the monochromatic quantum dot layer.

7. The display device claimed as claim 1, further comprising a color filter layer that is disposed on the light exiting side of each sub-pixel unit and corresponds to a color of each sub-pixel unit, wherein the color filter and the monochromatic quantum dot layer are insulated from each other.

8. The display device claimed as claim 1, wherein each monochromatic quantum dot layer emits red light, green light, yellow light, orange light, or cyan light after it is excited by light emitted from the electroluminescence structure.

9. The display device claimed as claim 1, wherein the electroluminescence structure is driven in an active manner.

10. A display apparatus comprising the quantum dot electroluminescence display device claimed as claim 1.

11. The display device claimed as claim 2, wherein a material of the light-emitting layer is a material for emitting blue light;

each of the pixel units has the sub-pixel units for displaying N colors, among which, sub-pixel units of (N−1) colors are each provided with the monochromatic quantum dot layer, where N is a positive integer larger than or equal to 2.

12. The display device claimed as claim 2, wherein a material of the light-emitting layer is a material for emitting ultraviolet light;

the plurality of sub-pixel units of each of the pixel units are each provided with the monochromatic quantum dot layer.

13. The display device claimed as claim 2, further comprising a color filter layer that is disposed on the light exiting side of each sub-pixel unit and corresponds to a color of each sub-pixel unit, wherein the color filter and the monochromatic quantum dot layer are insulated from each other.

14. The display device claimed as claim 3, wherein a material of the light-emitting layer is a material for emitting blue light;

each of the pixel units has the sub-pixel units for displaying N colors, among which, sub-pixel units of (N−1) colors are each provided with the monochromatic quantum dot layer, where N is a positive integer larger than or equal to 2.

15. The display device claimed as claim 3, wherein a material of the light-emitting layer is a material for emitting ultraviolet light;

the plurality of sub-pixel units of each of the pixel units are each provided with the monochromatic quantum dot layer.

16. The display device claimed as claim 3, further comprising a color filter layer that is disposed on the light exiting side of each sub-pixel unit and corresponds to a color of each sub-pixel unit, wherein the color filter and the monochromatic quantum dot layer are insulated from each other.

17. The display device claimed as claim 4, wherein a material of the light-emitting layer is a material for emitting blue light;

each of the pixel units has the sub-pixel units for displaying N colors, among which, sub-pixel units of (N−1) colors are each provided with the monochromatic quantum dot layer, where N is a positive integer larger than or equal to 2.

18. The display device claimed as claim 4, wherein a material of the light-emitting layer is a material for emitting ultraviolet light;

the plurality of sub-pixel units of each of the pixel units are each provided with the monochromatic quantum dot layer.

19. The display device claimed as claim 4, further comprising a color filter layer that is disposed on the light exiting side of each sub-pixel unit and corresponds to a color of each sub-pixel unit, wherein the color filter and the monochromatic quantum dot layer are insulated from each other.

* * * * *